US009633747B2

United States Patent
Lee

(10) Patent No.: US 9,633,747 B2
(45) Date of Patent: Apr. 25, 2017

(54) SEMICONDUCTOR MEMORY DEVICES AND METHODS OF TESTING OPEN FAILURES THEREOF

(71) Applicant: SK hynix Inc., Icheon-si, Gyeonggi-do (KR)

(72) Inventor: Sang Kwon Lee, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 1074 days.

(21) Appl. No.: 13/845,173

(22) Filed: Mar. 18, 2013

(65) Prior Publication Data

US 2014/0156213 A1 Jun. 5, 2014

(30) Foreign Application Priority Data

Dec. 4, 2012 (KR) .................. 10-2012-0139861

(51) Int. Cl.
| | |
|---|---|
| G11C 29/12 | (2006.01) |
| G11C 29/02 | (2006.01) |
| G11C 29/08 | (2006.01) |
| G11C 29/04 | (2006.01) |
| G11C 29/44 | (2006.01) |

(52) U.S. Cl.
CPC ............ *G11C 29/025* (2013.01); *G11C 29/08* (2013.01); *G11C 29/12* (2013.01); *G11C 2029/0405* (2013.01); *G11C 2029/4402* (2013.01)

(58) Field of Classification Search
CPC ....... G11C 29/025; G11C 29/12; G11C 29/08; G11C 2029/4402; G11C 2029/0405
See application file for complete search history.

(56) References Cited

U.S. PATENT DOCUMENTS

| | | | | | |
|---|---|---|---|---|---|
| 6,144,584 | A | * | 11/2000 | Kunori | G11C 16/0408 257/E21.682 |
| 2003/0177415 | A1 | * | 9/2003 | Togashi | G11C 29/4401 714/30 |
| 2011/0267911 | A1 | * | 11/2011 | Jung | G11C 29/025 365/201 |
| 2013/0170305 | A1 | * | 7/2013 | Kim | G11C 29/28 365/189.07 |
| 2014/0156213 | A1 | * | 6/2014 | Lee | G11C 29/025 702/120 |

FOREIGN PATENT DOCUMENTS

| | | |
|---|---|---|
| KR | 1020070104165 A | 10/2007 |
| KR | 1020100050138 A | 5/2010 |

* cited by examiner

*Primary Examiner* — Khamdan Alrobaie
(74) *Attorney, Agent, or Firm* — William Park & Associates Ltd.

(57) ABSTRACT

Semiconductor memory devices are provided. The semiconductor memory device includes an input/output (I/O) drive controller, a data I/O unit and a data transmitter. The data I/O unit selectively drives a first global I/O line and first/second global I/O lines according to the first or second test modes. The data transmitter selectively transfers the data on the first global I/O line onto first and second local I/O lines to store the data on the first global I/O line, and the data on the first and second global I/O lines onto the first and second local I/O lines according to the first or second test modes.

17 Claims, 8 Drawing Sheets

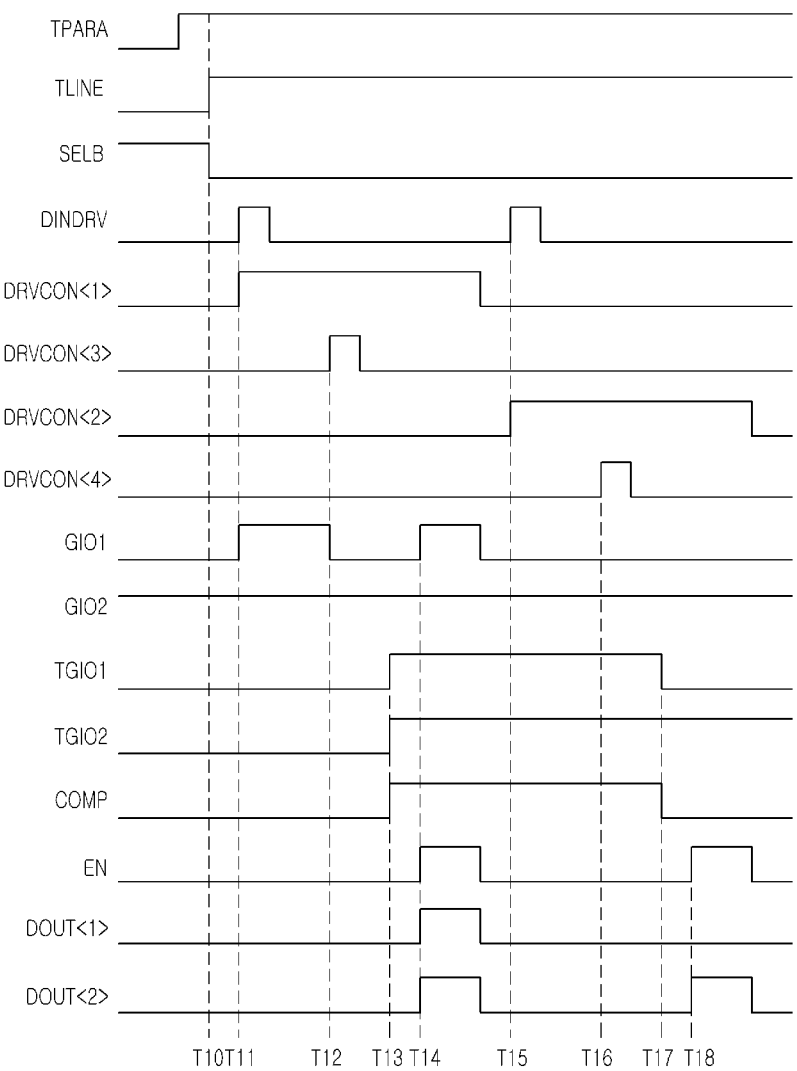

SEMICONDUCTOR MEMORY DEVICES AND METHODS OF TESTING OPEN FAILURES THEREOF

CROSS-REFERENCE TO RELATED APPLICATION

The present application claims priority under 35 U.S.C 119(a) to Korean Application No. 10-2012-0139861, filed on Dec. 4, 2012, in the Korean Intellectual Property Office, which is incorporated herein by reference in its entirety as set forth in full.

BACKGROUND

Various Embodiments of the present disclosure generally relate to semiconductor memory devices and methods of testing open failures thereof.

Semiconductor integrated circuit devices may be fabricated using a plurality of unit processes and may be classified into good chips or failed chips through a function test. The function test may be performed to evaluate functions of peripheral circuits and memory cells constituting the semiconductor integrated circuit devices. Most of the semiconductor integrated circuit devices may tend to exhibit single bit fails more than dual bit fails. Accordingly, as the semiconductor integrated circuit devices increases a density of integration, test time of the highly integrated semiconductor integrated circuit devices have been more increased. Hence, a parallel test has been proposed to reduce the test time. The parallel test may be performed by simultaneously writing the same data into a plurality of memory cells of the semiconductor memory device and by simultaneously reading out the data stored in the plurality of memory cells. Thus, the parallel test may reduce the test time.

In general, test input/output (I/O) lines in addition to global I/O lines may be required to perform the parallel test. That is, when a read operation is executed in the parallel test mode, the data stored in the memory cells may be loaded on a plurality of test I/O lines and the data levels on the plurality of test I/O lines may be detected or sensed to discriminate whether at least one of the memory cells normally operate or not. That is, when the parallel test is performed, the data stored in the memory cells may be outputted through the test I/O lines instead of the global I/O lines through which the data stored in the memory cells are outputted in a normal read mode.

SUMMARY

According to an embodiment, a semiconductor memory device includes an input/output (I/O) drive controller, a data I/O unit and a data transmitter. The input/output (I/O) drive controller is configured to generate drive control signals and an input control signal for driving first and second global I/O lines in a first test mode or a second test mode. The data I/O unit is configured to drive the first global I/O line in response to an input data when a write operation is executed in the first test mode and to drive the first and second global I/O lines in response to the drive control signals when the write operation is executed in the second test mode. The data transmitter is configured to transfer data on the first global I/O line onto first and second local I/O lines to store the data on the first global I/O line in a memory cell array portion when the write operation is executed in the first test mode. The data transmitter is also configured to transfer data on the first and second global I/O lines onto the first and second local I/O lines to store the data on the first and second global I/O lines in the memory cell array portion when the write operation is executed in the second test mode.

According to an embodiment, a semiconductor memory device includes an input/output (I/O) drive controller, a data I/O unit and a data transmitter. The input/output (I/O) drive controller is configured to generate drive control signals and an input control signal for driving first and second global I/O lines in response to a write command signal and a read command signal in a test mode. The input/output (I/O) drive controller is also configured to generate a comparison signal by comparing data on a first test line with data on a second test line in the test mode. The data I/O unit is configured to drive the first and second global I/O lines in response to the drive control signals when a write operation is executed in the test mode. The data I/O unit is also configured to output the data on the first and second global I/O lines when a read operation is executed in the test mode. The data transmitter is configured to transfer data on the first and second global I/O lines to first and second local I/O lines to store the data on the first and second global I/O lines in a memory cell array portion when the write operation is executed in the test mode. The data transmitter is also configured to transfer the data outputted from the memory cell array portion through the first and second local I/O lines to the first and second global I/O lines and the first and second test lines when the read operation is executed in the test mode.

According to an embodiment, the I/O drive controller includes a selection signal generator, a drive control signal generator, a write controller and a comparison signal generator. The selection signal generator configured to generate a selection signal enabled in the test mode in response to a parallel test signal and a line test signal. The drive control signal generator configured to generate the drive control signals selectively enabled in response to the write command signal and the read command signal in the test mode. The write controller configured to generate an input control signal enabled in response to the write command signal and the read command signal when the write operation is executed in the test mode. The comparison signal generator configured to transfer the comparison signal to the first global I/O line when the read operation is executed in the test mode, wherein the drive control signals include first to fourth drive control signals.

According to an embodiment, the parallel test signal is enabled to activate the test mode that stores the data generated by driving the first and second global I/O lines in the memory cell array portion and outputs the data stored in the memory cell array portion through the first and second global I/O lines to evaluate failures of the first and second global I/O lines, wherein the line test signal is enabled to activate the test mode, and the data I/O unit operates without reception of input data when the write operation is executed in the test mode.

According to an embodiment, the data I/O unit drives the first and second global I/O lines to a first level in response to the drive control signals at a time that the write operation begins in the test mode.

According to an embodiment, the data I/O unit drives the first and second global I/O lines to a second level in response to the drive control signals after a predetermined period elapses from the time that the write operation begins in the test mode.

According to an embodiment, the data I/O unit includes a first input driver, a second input driver, a first output driver and a second output driver. The first input driver configured to transfer a first input data to the first global I/O line in response to the line test signal or to drive the first global I/O line according to the first to fourth drive control signals. The second input driver configured to transfer a second input data to the second global I/O line in response to the line test signal or to drive the second global I/O line according to the first to fourth drive control signals. The first output driver configured to generate a first output data in response to data loaded on the first global I/O line when the read operation is executed in the test mode. The second output driver configured to generate a second output data in response to data loaded on the second global I/O line when the read operation is executed in the test mode.

According to an embodiment, the first input driver includes a first input unit, a first driver, a first transfer unit and a second driver. The first input unit configured to transfer the first input data to a first node in response to the line test signal. The first driver configured to drive the first node in response to the first and second drive control signals. The first transfer unit configured to transfer a signal of the first node to a second node connected to the first global I/O line in response to the input control signal. The second driver configured to drive the second node in response to the third and fourth drive control signals.

According to an embodiment, the second input driver includes a second input unit, a third driver, a logic unit, a second transfer unit and a fourth driver. The second input unit configured to transfer the second input data to a third node in response to the line test signal. The third driver configured to drive the third node in response to the first and second drive control signals. The logic unit configured to generate a control signal enabled according to the input control signal and the selection signal when the write operation is executed in the test mode. The second transfer unit configured to transfer a signal of the third node to a fourth node connected to the second global I/O line in response to the control signal. The fourth driver configured to drive the fourth node in response to the third and fourth drive control signals.

According to an embodiment, the data transmitter includes a transmitter, a first write driver, a selection transmitter, a second write driver, a first sense amplifier and a second sense amplifier. The transmitter configured to transfer data loaded on the first global I/O line to a first transmission line when the write operation is executed in the test mode. The first write driver configured to drive the first local I/O line in response to data on the first transmission line to store the data on the first transmission line in a first memory cell block of the memory cell array portion. The selection transmitter configured to transfer data loaded on the first global I/O line to a second transmission line in response to the selection signal or to transfer data loaded on the second global I/O line to the second transmission line when the write operation is executed in the test mode. The second write driver configured to drive the second local I/O line in response to data on the second transmission line to store the data on the second transmission line in a second memory cell block of the memory cell array portion. The first sense amplifier configured to drive the first global I/O line and the first test line in response to data on the first local I/O line when the read operation is executed in the test mode. The second sense amplifier configured to drive the second global I/O line and the second test line in response to data on the second local I/O line when the read operation is executed in the test mode.

According to an embodiment, the selection transmitter includes a third driver and a fourth driver. The third driver configured to transfer data loaded on the first global I/O line to the second transmission line when the selection signal is disabled. The fourth driver configured to transfer data loaded on the second global I/O line to the second transmission line when the selection signal is enabled.

According to an embodiment, the comparison signal generator includes a comparator and a transfer unit. The comparator configured to compare data loaded on the first test line with data on the second test line to generate the comparison signal. The transfer unit configured to transfer the comparison signal to the first global I/O line in response to an enablement signal enabled when the read operation is executed in the test mode.

According to an embodiment, a method of testing a semiconductor memory device includes a step of writing data in a first memory cell block and a second memory cell block and a step of reading out data stored in the first and second memory cell blocks. Writing the data in the first and second memory cell blocks includes driving first and second global I/O lines in response to drive control signals generated in a test mode for evaluating failures of the first and second global I/O lines, storing the data on the first global I/O line in the first memory cell block, and storing the data on the second global I/O line in the second memory cell block. Reading out the data includes driving the first global I/O line and a first test line in response to data outputted from the first memory cell block and driving the second global I/O line and a second test line in response to data outputted from the second memory cell block.

According to an embodiment, the step of writing the data further comprises the step of blocking input data to be provided to the first and second global I/O lines.

According to an embodiment, wherein the step of writing the data further comprises the steps of driving the first and second global I/O lines to a first level in response to the drive control signals and driving the first and second global I/O lines to a second level in response to the drive control signals.

According to an embodiment, wherein the step of reading out the data further comprises a step of outputting a comparison signal generated by comparing the data on the first test line with the data on the second test line to the first global I/O line.

According to an embodiment, wherein the step of reading out the data further comprises the steps of generating a first output data in response to the data on the first global I/O line and generating a second output data in response to the data on the second global I/O line.

According to an embodiment, a semiconductor integrated circuit device, comprises a first test mode configured to test a plurality of memory cells by writing and reading data through a plurality of data lines; and a second test mode configured to test the plurality of data lines by driving the plurality of data lines.

BRIEF DESCRIPTION OF THE DRAWINGS

Embodiments of the inventive concept will become more apparent in view of the attached drawings and accompanying detailed description, in which:

FIG. 8 is a timing diagram illustrating a second test mode of the semiconductor memory device according to an embodiment.

DETAILED DESCRIPTION OF THE EMBODIMENTS

Example embodiments of the inventive concept will be described hereinafter with reference to the accompanying drawings. However, the example embodiments described herein are for illustrative purposes only and are not intended to limit the scope of the inventive concept.

Figure 1:
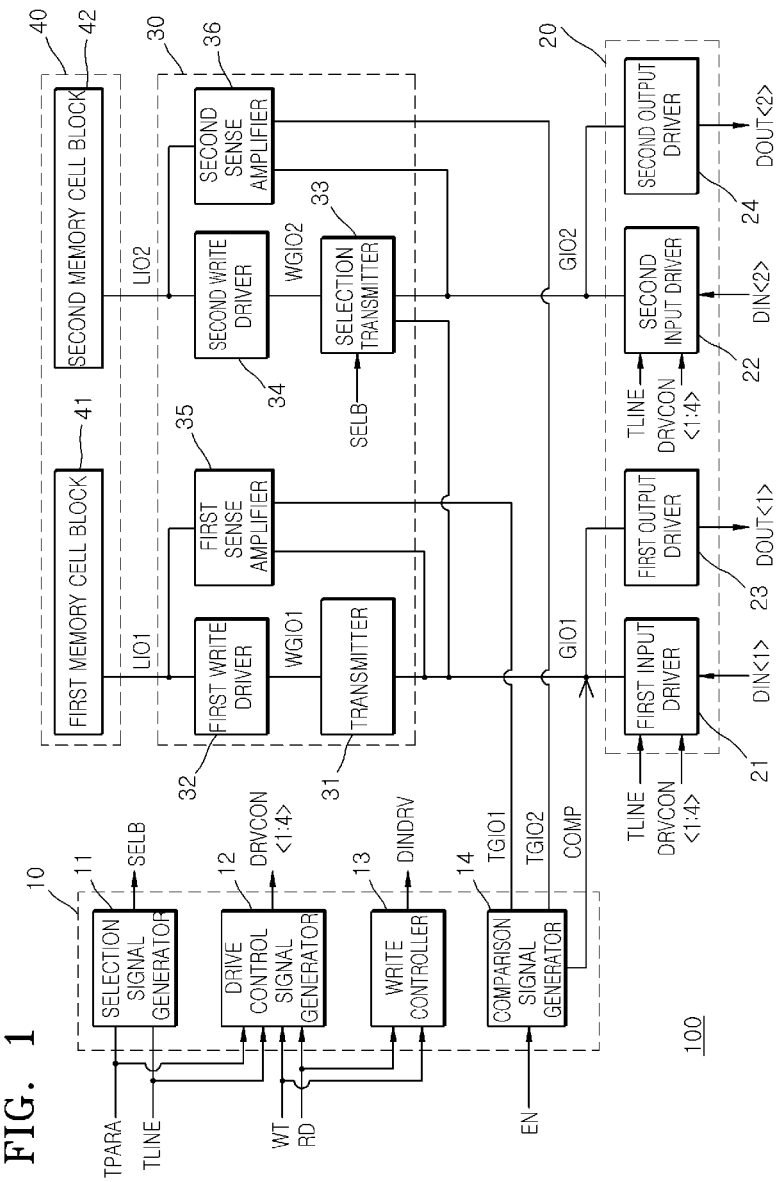
FIG. 1 is a block diagram illustrating a configuration of a semiconductor memory device according to an embodiment.

As illustrated in FIG. 1, a semiconductor integrated circuit, for example, a semiconductor memory device 100 may be configured to include an input/output (I/O) drive controller 10, a data I/O unit 20, a data transmitter 30 and a memory cell array portion 40.

The I/O drive controller 10 may be configured to include a selection signal generator 11, a drive control signal generator 12, a write controller 13 and a comparison signal generator 14.

The selection signal generator 11 may be configured to generate a selection signal SELB in response to a parallel test signal TPARA and a line test signal TLINE. The selection signal SELB is enabled during a second test mode. The semiconductor memory device 100 enters the second test mode when the parallel test signal TPARA and the line test signal TLINE are enabled. The parallel test signal TPARA may be enabled to store data loaded on a first global I/O line GIO1 in the memory cell array portion 40. The semiconductor memory device 10 may enter a first test by the parallel test signal TPARA. The first test compares the data stored in the memory cell array portion 40 with each other to evaluate failures of a plurality of memory cells. Further, the parallel test signal TPARA may be enabled to store data generated by driving the data loaded on the first global I/O line GIO1 and a second global I/O line GIO2 in the memory cell array portion 40 and to activate the second test mode that outputs the data stored in the memory cell array portion 40 through the first and second global I/O lines GIO1 and GIO2 to evaluate open failures of the first and second global I/O lines GIO1 and GIO2. The line test signal TLINE may be enabled to activate the second test mode. That is, the semiconductor memory device 100 may operate in the first test mode when the parallel test signal TPARA is enabled and the line test signal TLINE is disabled, and the semiconductor memory device 100 may operate in the second test mode when both the parallel test signal TPARA and the line test signal TLINE are enabled.

The drive control signal generator 12 may be configured to generate a plurality of drive control signals DRVCON<1:4> in response to the parallel test signal TPARA, the line test signal TLINE, a write command signal WT and a read command signal RD. First and second drive control signals DRVCON<1:2> of the plurality of drive control signals DRVCON<1:4> are selectively enabled when both the parallel test signal TPARA and the line test signal TLINE are enabled to activate the second test mode and when a write operation is executed in response to a write command signal WT and a read command signal RD. Third and fourth drive control signals DRVCON<3:4> of the plurality of drive control signals DRVCON<1:4> are enabled after predetermined periods from a beginning of the write operation.

The write controller 13 may be configured to receive the write command signal WT and the read command signal RD and generate an input control signal DINDRV when the write operation is executed in the first or second test mode.

The comparison signal generator 14 may be configured to receive an enablement signal EN to output a comparison signal COMP. The comparison signal is generated by comparing the data on a first test line TGIO1 with the data on a second test line TGIO2 and outputted through the first global I/O line GIO1 when the read operation is executed in the first or second test mode. For example, if the enablement signal EN is enabled, the comparison signal COMP may be outputted onto the first global I/O line GIO1 when the read operation is executed in the first or second test mode.

The data I/O unit 20 may be configured to include a first input driver 21, a second input driver 22, a first output driver 23 and a second output driver 24.

The first input driver 21 may be configured to receive a first input data DIN<1> to drive the first global I/O line GIO1 when the write operation is executed in a normal mode or the first test mode. Further, the first input driver 21 may configured to receive the line test signal TLINE and block an input the first input data DIN<1> when the write operation is executed in the second test mode. Further, the first input driver 21 may configured to receive the first and second drive control signals DRVCON<1:2> and drive the first global I/O line GIO1 when the write operation is executed in the second test mode. In addition, the first input driver 21 may configured to receive the third and fourth drive control signals DRVCON<3:4> and drive the first global I/O line GIO1 after a predetermined period from a beginning of the write operation.

The second input driver 22 may be configured to receive a second input data DIN<2> to drive the second global I/O line GIO2 when the write operation is executed in the normal mode. The second input driver 22 may not drive the second global I/O line GIO2 when the write operation is executed in the first test mode. Further, when the write operation is executed in the second test mode, the second input driver 22 may be configured to receive the line test signal TLINE and block an inputting of the second input data DIN<2>. Further, the second input driver 22 may be configured to drive the second global I/O line GIO2 in response to the first and second drive control signals DRVCON<1:2>. In addition, the second input driver 22 may be configured to drive the data loaded on the second global I/O line GIO2 in response to the third and fourth drive control signals DRVCON<3:4> after a predetermined period from a beginning of the write operation begins, thereby driving the second global I/O line GIO2.

The first output driver 23 may be configured to receive the data loaded on the first global I/O line GIO1 to generate a first output data DOUT<1> when the read operation is executed in the normal mode, the first test mode or the second test mode.

The second output driver 24 may receive the data loaded on the second global I/O line GIO2 to generate a second output data DOUT<2> when the read operation is executed in the normal mode or the second test mode. The second output driver 24 may not operate when the read operation is executed in the first test mode.

The data transmitter 30 may be configured to include a transmitter 31, a first write driver 32, a selection transmitter 33, a second write driver 34, a first sense amplifier 35 and a second sense amplifier 36.

The transmitter 31 may be configured to transfer the data loaded on the first global I/O line GIO1 to a first transmission line WGIO1 when the write operation is executed in the normal mode, the first test mode or the second test mode.

The first write driver 32 may be configured to receive the data loaded on the first transmission line WGIO1 and provide the data of the first transmission line WGIO1 to the memory cell array portion 40 through a first local I/O line LIO1, to store the data on the first transmission line WGIO1 into a first memory cell block 41 when the write operation is executed in the normal mode, the first test mode or the second test mode.

The selection transmitter 33 may be configured to transfer the data loaded on the second global I/O line GIO2 to a second transmission line WGIO2 in response to the selection signal SELB when the write operation is executed in the normal mode or the second test mode.

The second write driver 34 may be configured to receive the data loaded on the second transmission line WGIO2 and provide the data of the second transmission line WGIO2 to the memory cell array portion 40 through a second local I/O line LIO2 to store the data on the second transmission line WGIO2 into a second memory cell block 42 when the write operation is executed in the normal mode, the first test mode or the second test mode.

The first sense amplifier 35 may be configured to receive the data on the first local I/O line LIO1 and drive the first global I/O line GIO1 when the read operation is executed in the normal mode. Further the first sense amplifier 35 may be configured to receive the data loaded on the first local I/O line LIO1, drive the first global I/O line GIO1 and the first test line TGIO1 when the read operation is executed in the first or second test mode.

The second sense amplifier 36 may be configured to receive the data loaded on the second local I/O line LIO2, drive the second global I/O line GIO2 when the read operation is executed in the normal mode. Further the second sense amplifier 36 may be configured to receive the data loaded on the second local I/O line LIO2, drive the second test line TGIO2 when the read operation is executed in the first test mode. In addition, the second sense amplifier 36 may be configured to receive the data loaded on the second local I/O line LIO2, drive the second global I/O line GIO2 and the second test line TGIO2 when the read operation is executed in the second test mode.

The memory cell array portion 40 may be configured to include a first memory cell block 41 having a plurality of memory cells and a second memory cell block 42 having a plurality of memory cells. The first memory cell block 41 may be configured to receive the data through the first local I/O line LIO1 and the second memory cell block 42 may be configured to receive the data through the second local I/O line LIO2.

A configuration of the selection signal generator 11 will be described more fully hereinafter with reference to FIG. 2.

Figure 2:
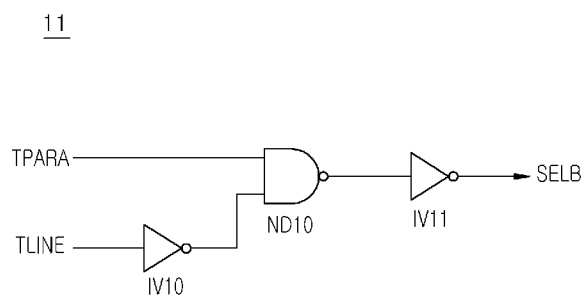
FIG. 2 is a circuit diagram illustrating a selection signal generator of a I/O drive controller included in the semiconductor memory device shown in FIG. 1.

Referring to FIG. 2, the selection signal generator 11 may be configured to include an inverter IV10 inversely buffering the line test signal TLINE, a NAND gate ND10 executing a NAND operation of an output signal of the inverter IV10 and the parallel test signal TPARA, and an inverter IV11 inversely buffering an output signal of the NAND gate ND10 to generate the selection signal SELB. That is, the selection signal generator 11 may receive the parallel test signal TPARA and the line test signal TLINE to generate the selection signal SELB which is enabled in the normal mode or the second test mode.

A configuration of the comparison signal generator 14 will be described more fully hereinafter with reference to FIG. 3.

Figure 3:
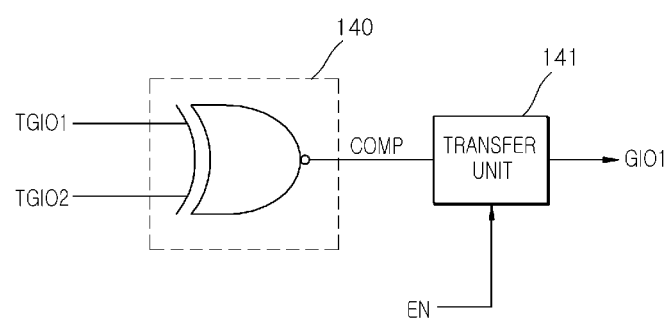
FIG. 3 is a block diagram illustrating a comparison signal generator of the I/O drive controller included in the semiconductor memory device shown in FIG. 1.

Referring to FIG. 3, the comparison signal generator 14 may be configured to include a comparator 140 comparing the data on the first test line TGIO1 with the data on the second test line TGIO2 to generate the comparison signal COMP and a transfer unit 141 transferring the comparison signal COMP onto the first global I/O line GIO1 in response to the enablement signal EN. That is, the comparison signal generator 14 may transfer the comparison signal COMP, which is generated by comparing the data on the first test line TGIO1 with the data on the second test line TGIO2, to the first global I/O line GIO1 when the read operation is executed in the first or second test mode. For example, the comparator 140 may be an exclusive NOR gate.

A configuration of the first input driver 21 will be described more fully hereinafter with reference to FIG. 4.

Figure 4:
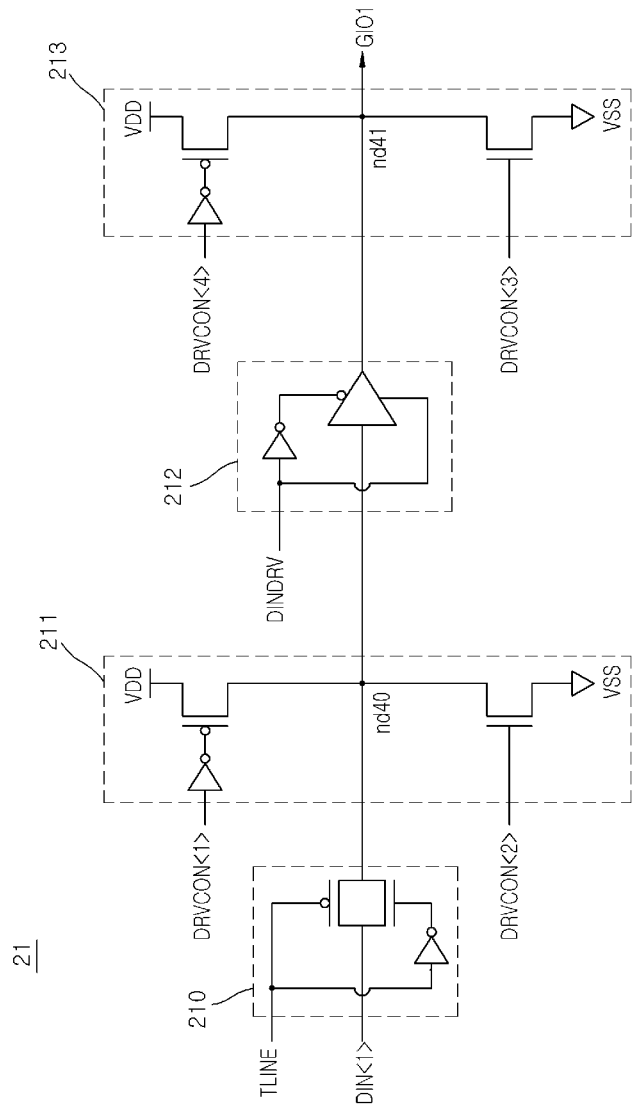
FIG. 4 is a circuit diagram illustrating a first input driver of a data I/O unit included in the semiconductor memory device shown in FIG. 1.

Referring to FIG. 4, the first input driver 21 may be configured to include a first input unit 210, a first driver 211, a first transfer unit 212 and a second driver 213.

The first input unit 210 may be configured to transfer the first input data DIN<1> to a first node ND40 according to the line test signal TLINE. For example, the first input unit 210 may be a transfer gate.

The first driver 211 may be configured to pull up the first node ND40 when the first drive control signal DRVCON<1> is enabled and pull down the first node ND40 when the second drive control signal DRVCON<2> is enabled.

The first transfer unit 212 may be configured to output a signal on the first node ND40 to a second node ND41 electrically connected to the first global I/O line GIO1 when the input control signal DINDRV is enabled.

The second driver 213 may be configured to pull up the second node ND41 when the fourth drive control signal DRVCON<4> is enabled and pull down the second node ND41 when the third drive control signal DRVCON<3> is enabled. That is, the first input driver 21 may transfer the first input data DIN<1> to the first global I/O line GIO1 when the write operation is executed in the normal mode or the first test mode and may drive the first global I/O line GIO1 without reception of the first input data DIN<1> when the write operation is executed in the second test mode.

A configuration of the second input driver 22 will be described more fully hereinafter with reference to FIG. 5.

Figure 5:
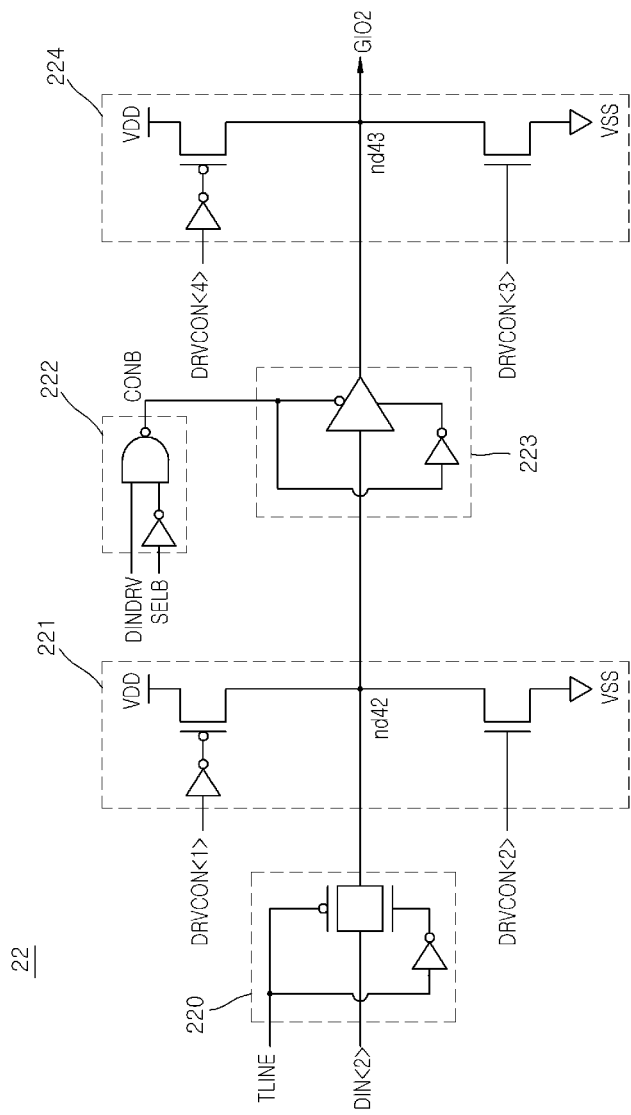
FIG. 5 is a circuit diagram illustrating a second input driver of a data I/O unit included in the semiconductor memory device shown in FIG. 1.

Referring to FIG. 5, the second input driver 22 may be configured to include a second input unit 220, a third driver 221, a logic unit 222, a second transfer unit 223, and a fourth driver 224

The second input unit 2210 may be transferred the second input data DIN<2> to a third node ND42 according to the line test signal TLINE.

The third driver 221 may be configured to pull up the third node ND42 when the first drive control signal DRVCON<1> is enabled and pull down the third node ND42 when the second drive control signal DRVCON<2> is enabled.

The logic unit 222 may be configured to generate a control signal CONB in response to the input control signal DINDRV and the selection signal SELB. For example, the logic unit 222 may include a inverter for inverting the selection signal SELB and a NAND gate for NAND operating the inversed selection signal SELB and the input control signal DINDRV.

The second transfer unit 223 may be configured to output a signal on the third node ND42 to a fourth node ND43 electrically connected to the second global I/O line GIO2 when the control signal CONB is enabled.

The fourth driver 224 may be configured to pull up the fourth node ND43 when the fourth drive control signal DRVCON<4> is enabled and pull down the fourth node ND43 when the third drive control signal DRVCON<3> is enabled. That is, the second input driver 22 may transfer the second input data DIN<2> to the second global I/O line GIO2 when the write operation is executed in the normal mode and may not transfer the second input data DIN<2> to the second global I/O line GIO2 when the write operation is executed in the first test mode. Further, the second input driver 22 may drive the second global I/O line GIO2 without reception of the second input data DIN<2> when the write operation is executed in the second test mode.

A configuration of the selection transmitter 33 will be described more fully hereinafter with reference to FIG. 6.

Figure 6:
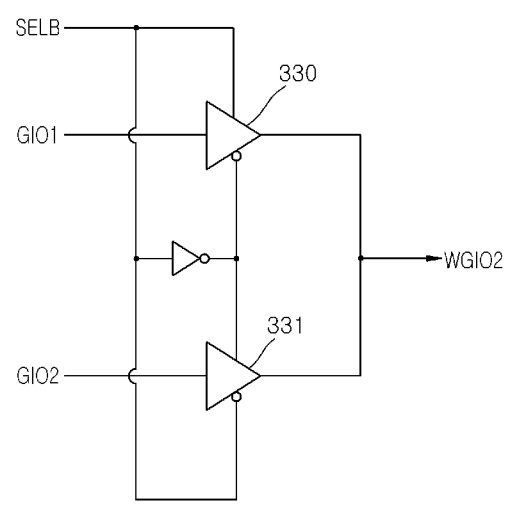
FIG. 6 is a circuit diagram illustrating a selection transmitter of a data transmitter included in the semiconductor memory device shown in FIG. 1.

Referring to FIG. 6, the selection transmitter 33 may be configured to include a third driver 330 and the fourth driver 331. The third driver 330 may be configured to operate when the selection signal SELB is disabled to transfer the data on the first global I/O line GIO1 to the second transmission line WGIO2. The fourth driver 331 may be configured to operate when the selection signal SELB is enabled to transfer the data on the second global I/O line GIO2 to the second transmission line WGIO2. That is, the selection transmitter 33 may transfer the data on the first global I/O line GIO1 to the second transmission line WGIO2 when the write operation is executed in the first test mode. In addition, the selection transmitter 33 may transfer the data on the second global I/O line GIO2 to the second transmission line WGIO2 when the write operation is executed in the normal mode or the second test mode.

An operation of the semiconductor memory device in the first test mode which is capable of sorting failed memory cells will be described in conjunction with an example that both the first and second input data DIN<1:2> have a logic "high" level with reference to FIG. 7.

Figure 7:
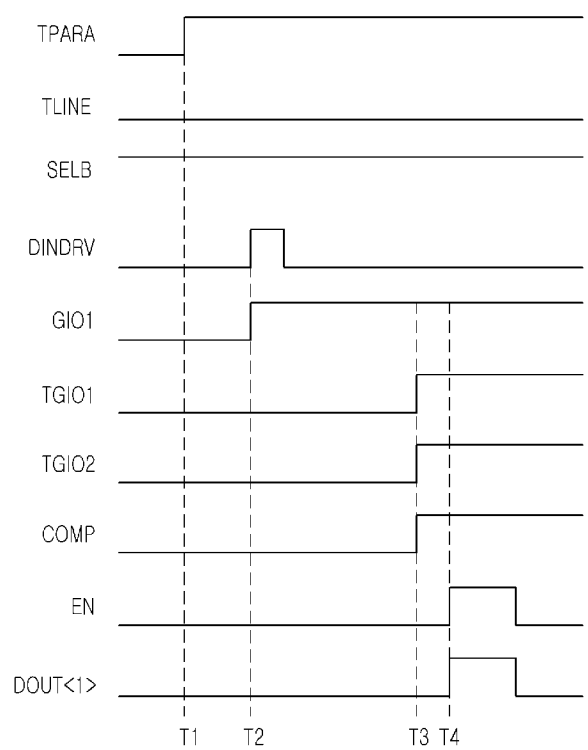
FIG. 7 is a timing diagram illustrating a first test mode of the semiconductor memory device according to an embodiment.

Referring to FIG. 7, at a time T1, the selection signal generator 11 of the I/O drive controller 10 may receive the parallel test signal TPARA enabled to have a logic "high" level and the line test signal TLINE disabled to have a logic "low" level, to generate the selection signal SELB disabled to have a logic "high" level in order to enter the first test mode.

Subsequently, if the write operation is executed at a time T2, the drive control signal generator 12 of the I/O drive controller 10 may receive the write command signal WT in the first test mode, thus stop to generate the first to fourth drive control signals DRVCON<1:4>. The write controller 13 may receive the write command signal WT in the first test mode to generate the input control signal DINDRV which is enabled to have a logic "high" level.

The first input driver 21 of the data I/O unit 20 may provide the first input data DIN<1> to the first global I/O line GIO1 in response to the line test signal TLINE having a logic "low" level. The second input driver 22 of the data I/O unit 20 may provide the second input data DIN<2> to the second global I/O line GIO2 in response to the line test signal TLINE having a logic "low" level.

The transmitter 31 of the data transmitter 30 may receive the data of a logic "high" level on the first global I/O line GIO1 and may transfer the data of a logic "high" level on the first global I/O line GIO1 to the first transmission line WGIO1. The first write driver 32 may drive the first local I/O line LIO1 in response to the data loaded on the first transmission line WGIO1 to store the data on the first transmission line WGIO1 into the first memory cell block 41. The selection transmitter 33 may transfer the data loaded on the first global I/O line GIO1 to the second transmission line WGIO2 in response to the selection signal SELB having a logic "high" level. In such a case, the selection transmitter 33 may not receive the data on the second global I/O line GIO2 because the selection signal SELB has a logic "high" level.

The second write driver 34 may drive the second local I/O line LIO2 in response to the data loaded on the second transmission line WGIO2 to store the data on the second transmission line WGIO2 into the second memory cell block 42.

Next, if the read operation is executed at a time T3, the first sense amplifier 35 of the data transmitter 30 may receive the data having a logic "high" level outputted from the first memory cell block 41 through the first local I/O line LIO1 to drive the first test line TGIO1 to a logic "high" level. The second sense amplifier 36 of the data transmitter 30 may receive the data having a logic "high" level outputted from the second memory cell block 42 through the second local I/O line LIO2 to drive the second test line TGIO2 to a logic "high" level. The comparator 140 of the comparison signal generator 14 may compare the data on the first test line TGIO1 with the data on the second test line TGIO2 to generate the comparison signal COMP having a logic "high" level.

Subsequently, if the enablement signal EN is enabled at a time T4, the transfer unit 141 may transmit the comparison signal COMP having a logic "high" level to the first global I/O line GIO1. The first output driver 23 of the data I/O unit 20 may receive the signal having a logic "high" level on the first global I/O line GIO1 to generate the first output data DOUT<1> having a logic "high" level. Since the first output data DOUT<1> has a logic "high" level and the first and second input data DIN<1:2> have a logic "high" level, no failed memory cells may exist in the first and second memory cell blocks 41 and 42.

As described above, the first test mode may be used to evaluate whether failed memory cells exist in the memory cell array portion 40.

Now, an operation of the semiconductor memory device in the second test mode which is capable of evaluating open failures of the global I/O lines will be described in conjunction with an example that the first global I/O line GIO1 has an open failure and has a logic "high" level with reference to FIG. 8.

Referring to FIG. 8, at a time T10, the selection signal generator 11 of the I/O drive controller 10 may generate the selection signal SELB enabled to have a logic "low" level in order to enter the second test mode in response to the parallel test signal TPARA and the line test signal TLINE which are enabled to have a logic "high" level.

Subsequently, if the write operation is executed at a time T11, the drive control signal generator 12 of the I/O drive controller 10 may receive the write command signal WT in the second test mode to generate the first drive control signal DRVCON<1> which is enabled to have a logic "high" level. The write controller 13 may receive the write command signal WT in the second test mode to generate the input control signal DINDRV which is enabled to have a logic "high" level.

The first input driver 21 of the data I/O unit 20 may pull up the first node ND40 in response to the first drive control signal DRVCON<1> having a logic "high" level to drive the first global I/O line GIO1 to a logic "high" level. The second input driver 22 of the data I/O unit 20 may pull up the third node ND42 in response to the first drive control signal DRVCON<1> having a logic "high" level to drive the second global I/O line GIO2 to a logic "high" level.

The transmitter 31 of the data transmitter 30 may transfer the data of a logic "high" level on the first global I/O line GIO1 to the first transmission line WGIO1. The first write driver 32 may drive the first local I/O line LIO1 in response to the data on the first transmission line WGIO1 to store the data on the first transmission line WGIO1 into the first memory cell block 41. The selection transmitter 33 may transfer the data of a logic "high" level on the second global I/O line GIO2 to the second transmission line WGIO2 in response to the selection signal SELB having a logic "low" level. In such a case, the selection transmitter 33 may not receive the data on the first global I/O line GIO1 because the selection signal SELB has a logic "low" level. The second write driver 34 may drive the second local I/O line LIO2 in response to the data loaded on the second transmission line WGIO2 to store the data on the second transmission line WGIO2 into the second memory cell block 42.

Next, the drive control signal generator 12 of the I/O drive controller 10 may generate the third drive control signal DRVCON<3> which is enabled to have a logic "high" level at a time T12 that a predetermined period elapses from the time T11 that the write operation begins. The first input driver 21 of the data I/O unit 20 may pull down the second node ND41 in response to the third drive control signal DRVCON<3> having a logic "high" level to drive the first global I/O line GIO1 to a logic "low" level. The second input driver 22 of the data I/O unit 20 may pull down the fourth node ND43 in response to the third drive control signal DRVCON<3> having a logic "high" level to drive the second global I/O line GIO2 to a logic "low" level. However, when the second global I/O line GIO2 has an open failure, the second global I/O line GIO2 may not be driven to a logic "low" level even though the second input driver 22 pulls down the fourth node ND43.

If the read operation is executed at a time T13, the first sense amplifier 35 of the data transmitter 30 may receive the data having a logic "high" level outputted from the first memory cell block 41 through the first local I/O line LIO1 to drive the first test line TGIO1 and the first global I/O line GIO1 to a logic "high" level. The second sense amplifier 36 of the data transmitter 30 may receive the data having a logic "high" level outputted from the second memory cell block 42 through the second local I/O line LIO2 to drive the second test line TGIO2 and the second global I/O line GIO2 to a logic "high" level. The comparator 140 of the comparison signal generator 14 may compare the data on the first test line TGIO1 with the data loaded on the second test line TGIO2 to generate the comparison signal COMP having a logic "high" level.

Subsequently, if the enablement signal EN is enabled at a time T14, the transfer unit 141 of the comparison signal generator 14 may transmit the comparison signal COMP having a logic "high" level to the first global I/O line GIO1. The first output driver 23 of the data I/O unit 20 may generate the first output data DOUT<1> having a logic "high" level in response to the signal having a logic "high" level on the first global I/O line GIO1. The second output driver 24 may receive to generate the second output data DOUT<2> having a logic "high" level, in response to the signal on the second global I/O line GIO2. The levels of the first and second output data DOUT<1:2> may be sensed or detected to evaluate whether an open failure exists in the global I/O lines GIO1 and GIO2. However, since the second global I/O line GIO2 has a logic "high" level due to an open failure, the second output data DOUT<2> may be generated to have a logic "high" level. Thus, the second global I/O line GIO2 may be evaluated as being normal without any open failures. Accordingly, the first and second global I/O lines GIO1 and GIO2 may be driven to a logic "low" level to execute the write operation and the read operation again.

Hereinafter, an operation of driving the first and second global I/O lines GIO1 and GIO2 to a logic "low" level will be described.

First, if the write operation is executed at a time T15, the drive control signal generator 12 of the I/O drive controller 10 may receive the write command signal WT in the second test mode to generate the second drive control signal DRVCON<2> which is enabled to have a logic "high" level and the write controller 13 may receive the write command signal WT in the second test mode to generate the input control signal DINDRV which is enabled to have a logic "high" level.

The first input driver 21 of the data I/O unit 20 may pull down the first node ND40 in response to the second drive control signal DRVCON<2> having a logic "high" level to drive the first global I/O line GIO1 to a logic "low" level. The second input driver 22 of the data I/O unit 20 may pull down the third node ND42 in response to the second drive control signal DRVCON<2> having a logic "high" level to drive the second global I/O line GIO2 to a logic "low" level. However, since the second global I/O line GIO2 has an open failure, the second global I/O line GIO2 may not be driven to a logic "low" level even though the second input driver 22 pulls down the third node ND42.

The transmitter 31 of the data transmitter 30 may transfer the data of a logic "low" level on the first global I/O line GIO1 to the first transmission line WGIO1. The first write driver 32 may drive the first local I/O line LIO1 in response to the data loaded on the first transmission line WGIO1 to store the data on the first transmission line WGIO1 into the first memory cell block 41. The selection transmitter 33 may transfer the data of a logic "high" level on the second global I/O line GIO2 to the second transmission line WGIO2 in response to the selection signal SELB having a logic "low" level. In such a case, the selection transmitter 33 may not receive the data on the first global I/O line GIO1 because the selection signal SELB has a logic "low" level. The second write driver 34 may drive the second local I/O line LIO2 in response to the data on the second transmission line WGIO2 to store the data on the second transmission line WGIO2 into the second memory cell block 42.

Next, the drive control signal generator 12 of the I/O drive controller 10 may generate the fourth drive control signal DRVCON<4> which is enabled to have a logic "high" level at a time T16 that a predetermined period elapses from the time T15 that the write operation begins. The first input driver 21 of the data I/O unit 20 may pull up the second node ND41 in response to the fourth drive control signal DRVCON<4> having a logic "high" level to drive the first global I/O line GIO1 to a logic "high" level. The second input driver 22 of the data I/O unit 20 may pull up the fourth node ND43 in response to the fourth drive control signal DRVCON<4> having a logic "high" level to drive the second global I/O line GIO2 to a logic "high" level.

If the read operation is executed at a time T17, the first sense amplifier 35 of the data transmitter 30 may receive the data having a logic "low" level outputted from the first memory cell block 41 through the first local I/O line LIO1 to drive the first test line TGIO1 and the first global I/O line GIO1 to a logic "low" level. The second sense amplifier 36 of the data transmitter 30 may receive the data having a logic "high" level outputted from the second memory cell block 42 through the second local I/O line LIO2 to drive the second test line TGIO2 and the second global I/O line GIO2 to a logic "high" level. The comparator 140 of the comparison signal generator 14 may compare the data on the first test line TGIO1 with the data on the second test line TGIO2 to generate the comparison signal COMP having a logic "low" level.

Subsequently, if the enablement signal EN is enabled at a time T18, the transfer unit 141 of the comparison signal generator 14 may transmit the comparison signal COMP having a logic "low" level to the first global I/O line GIO1. The first output driver 23 of the data I/O unit 20 may generate the first output data DOUT<1> having a logic "low" level in response to the signal having a logic "low" level on the first global I/O line GIO1. The second output driver 24 may generate the second output data DOUT<2> having a logic "high" level in response to the signal on the second global I/O line GIO2 to. The levels of the first and second output data DOUT<1:2> may be sensed or detected to evaluate whether an open failure exists in the global I/O lines GIO1 and GIO2. Since the second global I/O line GIO2 is not driven to a logic "low" level due to an open failure during the write operation, the second output data DOUT<2> may be generated to have a logic "high" level during the read operation. Thus, the second global I/O line GIO2 may be evaluated as being abnormal with an open failure.

As described above, the semiconductor memory device according to the embodiments may be configured to find out open failures of the global I/O lines in the second test mode.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor memory device comprising:
an input/output I/O drive controller configured to generate drive control signals and an input control signal for controlling first and second global I/O lines according to a first test mode or a second test mode;
a data I/O unit configured to drive the first global I/O line in response to an input data when a write operation is executed in the first test mode, and to drive the first and second global I/O lines in response to the drive control signals when the write operation is executed in the second test mode; and
a data transmitter configured to transfer data loaded on the first global I/O line onto first and second local I/O lines to store the data on the first global I/O line in a memory cell array portion when the write operation is executed in the first test mode, and configured to transfer data loaded on the first and second global I/O lines onto the first and second local I/O lines to store the data on the first and second global I/O lines in the memory cell array portion when the write operation is executed in the second test mode.

2. The semiconductor memory device of claim 1, wherein the I/O drive controller includes:

a selection signal generator configured to generate a selection signal enabled in the second test mode in response to a parallel test signal and a line test signal;
a drive control signal generator configured to generate the drive control signals selectively enabled in response to a write command signal and a read command signal in the second test mode; and
a write controller configured to generate the input control signal enabled in response to the write command signal and the read command signal when the write operation is executed in the first and second test mode,
wherein the drive control signals include first to fourth drive control signals.

3. The semiconductor memory device of claim 2, wherein the parallel test signal is enabled to activate the first test mode that stores the data on the first global I/O line in the memory cell array portion and compares the data stored in the memory cell array portion with each other to evaluate failures of a plurality of memory cells in the memory cell array portion.

4. The semiconductor memory device of claim 2, wherein the parallel test signal is enabled to activate the second test mode that stores the data generated by driving the first and second global I/O lines in the memory cell array portion and outputs the data stored in the memory cell array portion through the first and second global I/O lines to evaluate failures of the first and second global I/O lines.

5. The semiconductor memory device of claim 4, wherein the line test signal is enabled to activate the second test mode.

6. The semiconductor memory device of claim 1, wherein the data I/O unit operates without reception of the input data when the write operation is executed in the second test mode.

7. The semiconductor memory device of claim 1, wherein the data I/O unit configured to drive the first and second global I/O lines to have a first level in response to the drive control signals at a time that the write operation begins in the second test mode.

8. The semiconductor memory device of claim 7, wherein the data I/O unit configured to drive the first and second global I/O lines to have a second level being different from the first level in response to the drive control signals after a predetermined period elapses from the time that the write operation begins in the second test mode.

9. The semiconductor memory device of claim 2, wherein the data I/O unit includes:
a first input driver configured to transfer a first input data of the input data to the first global I/O line in response to the line test signal or to drive the first global I/O line according to the first to fourth drive control signals; and
a second input driver configured to transfer a second input data of the input data to the second global I/O line in response to the line test signal or to drive the second global I/O line according to the first to fourth drive control signals.

10. The semiconductor memory device of claim 9, wherein the first input driver includes:
a first input unit configured to transfer the first input data to a first node in response to the line test signal;
a first driver configured to drive the first node in response to the first and second drive control signals;
a first transfer unit configured to transfer a signal of the first node to a second node connected to the first global I/O line in response to the input control signal; and
a second driver configured to drive the second node in response to the third and fourth drive control signals.

11. The semiconductor memory device of claim 9, wherein the second input driver includes:
- a second input unit configured to transfer the second input data to a third node in response to the line test signal;
- a third driver configured to drive the third node in response to the first and second drive control signals;
- a logic unit configured to generate a control signal enabled according to the input control signal and the selection signal when the write operation is executed in the second test mode;
- a second transfer unit configured to transfer a signal of the third node to a fourth node connected to the second global I/O line in response to the control signal; and
- a fourth driver configured to drive the fourth node in response to the third and fourth drive control signals.

12. The semiconductor memory device of claim 2, wherein the data transmitter includes:
- a transmitter configured to transfer data on the first global I/O line to a first transmission line when the write operation is executed in the first and second test mode;
- a first write driver configured to drive the first local I/O line in response to data on the first transmission line to store the data on the first transmission line in a first memory cell block of the memory cell array portion;
- a selection transmitter configured to transfer data on the first global I/O line to a second transmission line in response to the selection signal when the write operation is executed in the first test mode or to transfer data on the second global I/O line to the second transmission line in response to the selection signal when the write operation is executed in the second test mode; and
- a second write driver configured to drive the second local I/O line in response to data on the second transmission line to store the data on the second transmission line in a second memory cell block of the memory cell array portion.

13. The semiconductor memory device of claim 12, wherein the selection transmitter includes:
- a third driver configured to transfer data on the first global I/O line to the second transmission line when the selection signal is disabled; and
- a fourth driver configured to transfer data loaded on the second global I/O line to the second transmission line when the selection signal is enabled.

14. The semiconductor memory device of claim 12, wherein the data transmitter further comprises:
- a first sense amplifier configured to drive the first global I/O line and the first test line in response to data on the first local I/O line when a read operation is executed in the first or second test mode; and
- a second sense amplifier configured to drive the second global I/O line and the second test line in response to data on the second local I/O line when the read operation is executed in the first or second test mode.

15. The semiconductor memory device of claim 14, wherein the I/O drive controller further comprises a comparison signal generator configured to compare data loaded on the first test line with data loaded on the second test line to generate a comparison signal and transfer the comparison signal to the first global I/O line when the read operation is executed in the first or second test mode.

16. The semiconductor memory device of claim 15, wherein the comparison signal generator includes:
- a comparator configured to compare data loaded on the first test line with data on the second test line to generate the comparison signal; and
- a transfer unit configured to transfer the comparison signal to the first global I/O line in response to an enablement signal enabled when the read operation is executed in the first or second test mode.

17. The semiconductor memory device of claim 14, wherein the data I/O unit further comprises:
- a first output driver configured to generate a first output data in response to data loaded on the first global I/O line when the read operation is executed in the first test mode or the second test mode; and
- a second output driver configured to generate a second output data in response to data on the second global I/O line when the read operation is executed in the second test mode.

* * * * *